US012119237B2

(12) United States Patent
Kuo et al.

(10) Patent No.: US 12,119,237 B2
(45) Date of Patent: Oct. 15, 2024

(54) SEMICONDUCTOR DEVICE PACKAGE HAVING METAL THERMAL INTERFACE MATERIAL

(71) Applicant: Taiwan Semiconductor Manufacturing Company, Ltd., Hsinchu (TW)

(72) Inventors: Chien-Li Kuo, Hsinchu (TW); Chin-Fu Kao, Taipei (TW); Chen-Shien Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/349,292

(22) Filed: Jul. 10, 2023

(65) Prior Publication Data
US 2023/0411173 A1    Dec. 21, 2023

Related U.S. Application Data

(62) Division of application No. 17/314,522, filed on May 7, 2021, now Pat. No. 11,742,218.

(51) Int. Cl.
*H01L 21/48* (2006.01)
*H01L 21/56* (2006.01)
(Continued)

(52) U.S. Cl.
CPC ...... *H01L 21/4882* (2013.01); *H01L 21/4853* (2013.01); *H01L 21/4857* (2013.01);
(Continued)

(58) Field of Classification Search
CPC ............. H01L 21/4882; H01L 21/4853; H01L 21/4857; H01L 21/565; H01L 23/3128;
(Continued)

(56) References Cited

U.S. PATENT DOCUMENTS

| 2004/0188814 | A1* | 9/2004 | Houle ................ H01L 23/42 |
| | | | 438/106 |
| 2017/0076960 | A1* | 3/2017 | Chen ................. H01L 24/27 |

(Continued)

FOREIGN PATENT DOCUMENTS

| TW | 202034411 A | 9/2020 |
| TW | 202109785 A | 3/2021 |

OTHER PUBLICATIONS

Chinese language office action dated Mar. 21, 2022, issued in application No. TW 110134158.

*Primary Examiner* — Patricia D Valenzuela
(74) *Attorney, Agent, or Firm* — McClure, Qualey & Rodack, LLP

(57) ABSTRACT

A semiconductor device package is provided, including a package substrate, a semiconductor device, a metal lid, and a metal thermal interface material (TIM). The package substrate has a first surface. The semiconductor device is disposed over the first surface of the package substrate. The metal lid is disposed over the semiconductor device and the package substrate. The metal TIM is interposed between the metal lid and the top surface of the semiconductor device for bonding the metal lid and the semiconductor device. A shape of the lateral sidewall of the metal TIM in a longitudinal section is concave arc, and the outermost point of the lateral sidewall is within the boundary of the semiconductor device.

20 Claims, 18 Drawing Sheets

(51) Int. Cl.
*H01L 23/00* (2006.01)
*H01L 23/31* (2006.01)
*H01L 23/367* (2006.01)
*H01L 23/538* (2006.01)

(52) U.S. Cl.
CPC ........ *H01L 21/565* (2013.01); *H01L 23/3128* (2013.01); *H01L 23/3675* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 21/56* (2013.01); *H01L 24/27* (2013.01); *H01L 24/743* (2013.01); *H01L 24/75* (2013.01); *H01L 2224/214* (2013.01)

(58) Field of Classification Search
CPC ............. H01L 23/3675; H01L 23/5383; H01L 23/5386; H01L 23/5389; H01L 24/19; H01L 24/20; H01L 21/56; H01L 24/27; H01L 2224/214; H01L 24/13; H01L 24/16; H01L 24/29; H01L 24/73; H01L 2224/16145; H01L 2224/16225; H01L 2224/73253; H01L 2225/107; H01L 2225/1094; H01L 2924/15311; H01L 2924/16152; H01L 2924/18161; H01L 25/50; H01L 21/568; H01L 2924/167; H01L 2924/181; H01L 21/50; H01L 23/3135; H01L 23/49816; H01L 23/5385; H01L 25/105; H01L 23/42; H01L 21/52; H01L 23/10; H01L 24/75; H01L 24/743
See application file for complete search history.

(56) References Cited

U.S. PATENT DOCUMENTS

| | | |
|---|---|---|
| 2018/0350754 A1 | 12/2018 | Huang et al. |
| 2020/0020606 A1 | 1/2020 | Kim et al. |
| 2020/0135613 A1 | 4/2020 | Chen et al. |
| 2020/0381334 A1* | 12/2020 | Visvanathan ....... H01L 25/0655 |
| 2021/0066151 A1 | 3/2021 | Hu et al. |

* cited by examiner

SEMICONDUCTOR DEVICE PACKAGE HAVING METAL THERMAL INTERFACE MATERIAL

PRIORITY CLAIM AND CROSS-REFERENCE

The present application is a Divisional of application Ser. No. 17/314,522 filed on May 7, 2021, now U.S. Pat. No. 11,742,218, the entirety of which is incorporated by reference herein.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

A package not only provides protection for semiconductor devices from environmental contaminants, but also provides a connection interface for the semiconductor devices packaged therein. One smaller type of packaging for semiconductors is a flip chip chip-scale package (FcCSP), in which a semiconductor device is placed upside-down on a substrate and bonded to the substrate using bumps. The substrate has wiring routed to connect the bumps on the semiconductor device to contact pads on the substrate that have a larger footprint. An array of solder balls is formed on the opposite side of the substrate and is used to electrically connect the packaged semiconductor devices to an end application.

Although existing packaging structures and methods for fabricating semiconductor device package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1G-1 illustrates a closed-up cross-sectional view of a portion of the semiconductor device package in FIG. 1G.

FIG. 1H-1 illustrates a closed-up cross-sectional view of a portion of the semiconductor device package in FIG. 1H.

FIG. 1H-2 is a closed-up cross-sectional view of a portion of a semiconductor device package in accordance with some other embodiments.

FIG. 1H-3 is a closed-up cross-sectional view of a portion of a semiconductor device package in accordance with some other embodiments.

FIG. 1H-4 is a closed-up cross-sectional view of a portion of a semiconductor device package in accordance with some other embodiments.

FIG. 2 is a schematic cross-sectional view of a semiconductor device package in accordance with some other embodiments.

FIG. 3 is a simplified flowchart illustrating a process for forming a semiconductor device package in accordance with some embodiments.

DETAILED DESCRIPTION

Figure 1A:
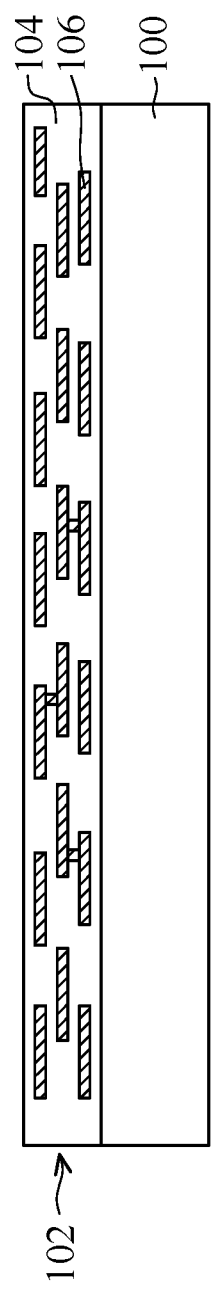
FIGS. 1A-1J are schematic cross-sectional views of various stages of a process for forming a semiconductor device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

A semiconductor device package and the method for forming the same are provided in accordance with various embodiments. Some variations of some embodiments are discussed. Throughout the various views and illustrative embodiments, like reference numbers are used to designate like elements.

In accordance with some embodiments of the present disclosure, a semiconductor device package includes a heat dissipation metal lid disposed over a semiconductor device, and a metal thermal interface material (TIM) provided between the metal lid and the semiconductor device to help dissipate heat from the semiconductor device. In some embodiments, a novel metal lid attachment approach is provided to change or control the thickness and lateral sidewall shape of the metal TIM (which will be described in detail later), thereby reducing the stress on the metal TIM and the risk of TIM delamination, for example, during thermal cycling. Accordingly, the reliability of the entire package is improved. In addition, in some embodiments, the metal lid can be directly bonded to the semiconductor device through the metal TIM, and an adhesive layer for attaching the metal lid to the package substrate can be omitted.

FIGS. 1A-1J are schematic cross-sectional views of various stages of a process for forming a semiconductor device package in accordance with some embodiments. The respective processes are shown as process flow 300 as shown in FIG. 3. Additional operations can be provided before, during, and/or after the stages described in these embodiments. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

As shown in FIG. 1A, an interposer substrate 102 is formed over a carrier substrate 100, in accordance with some embodiments. The carrier substrate 100 is used to provide temporary mechanical and structural support for the processing of build-up layers or structures during subsequent processing steps. The carrier substrate 100 may be a glass substrate, semiconductor substrate, or another suitable substrate. The interposer substrate 102 is used to provide electrical connection between semiconductor devices or components packaged thereon and a package substrate (which will be described later), after the carrier substrate 100 is removed at a subsequent stage illustrated in FIG. 1C.

In some embodiments, the interposer substrate 102 is an interposer wafer, which is free from active devices (such as transistors, diodes, or the like) and passive devices (such as resistors, capacitors, inductors, or the like). In some alternative embodiments, the interposer substrate 102 is a device wafer including active and/or passive devices thereon or therein.

In some embodiments, the interposer substrate 102 is a dielectric substrate, which includes a redistribution line (RDL) structure. As shown in FIG. 1A, the RDL structure may include multiple laminated insulating layers 104 and multiple conductive features 106 surrounded by the insulating layers 104. The conductive features 106 may include conductive lines, conductive vias, and/or conductive pads. In some embodiments, some of the conductive vias are stacked with each other. The upper conductive via is substantially aligned with the lower conductive via so as to have a shorter routing length. However, some of the conductive vias may be staggered vias in some cases with restricted routing. The upper conductive via is misaligned with the lower conductive via.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, Ti/Ni/Cu, Ti/Cu/Ti, Al/Ti/Ni/Ag, other suitable sub-layers, or a combination thereof.

The formation of the above RDL structure (i.e., interposer substrate 102) may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

In some other embodiments (not shown), the interposer substrate 102 may be a semiconductor substrate, which may be a bulk semiconductor substrate, a silicon-on-insulator (SOI) substrate, a multi-layered semiconductor substrate, or the like. The semiconductor material of the interposer substrate 102 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The interposer substrate 102 may be doped or undoped.

In some embodiments, through-vias (TVs) are formed in and penetrating through the semiconductor substrate, in order to provide electrical connection between devices mounted on opposite sides of the interposer substrate 102. The processes for forming through-vias are well known in the art and therefore not described herein. In some further embodiments, one or more interconnect structure layers (similar to the RDL structure of interposer substrate 102 illustrated in FIG. 1A) may be formed on one or both sides of the semiconductor substrate of interposer substrate 102 for routing.

Figure 1B:
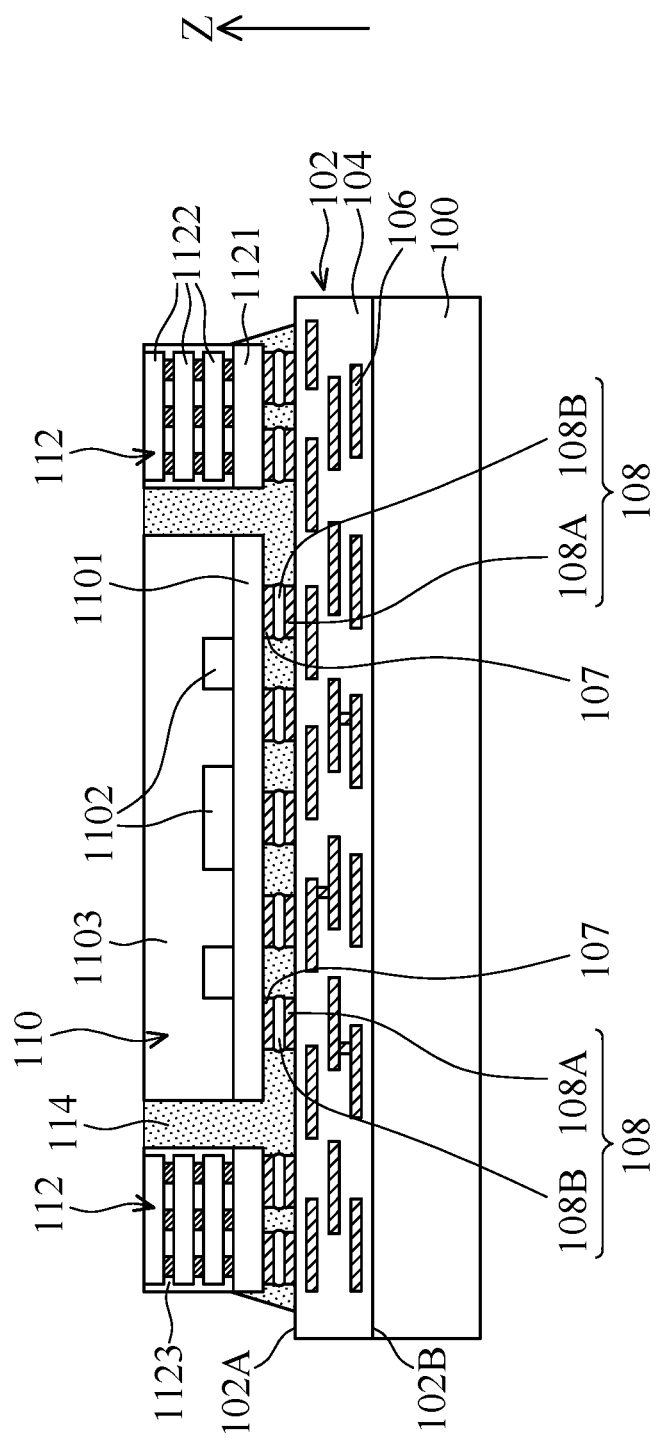

As shown in FIG. 1B, semiconductor dies 110 and semiconductor dies 112 (one semiconductor die 110 and two semiconductor dies 112 are shown for illustration) are disposed over the interposer substrate 102, in accordance with some embodiments. The semiconductor dies 110 and 112 may be placed over a first surface 102A (e.g., the upper surface shown in FIG. 1B) of the interposer substrate 102 using, for example, a pick-and-place tool. In some embodiments, one semiconductor die 110 is disposed between two semiconductor dies 112, but the disclosure is not limited thereto. For example, other arrangements and/or any other number of semiconductor dies 110 and 112 can be used in different embodiments. In the top view, each of the semiconductor dies 110 and 112 is generally rectangular or square.

The semiconductor dies 110 and the semiconductor dies 112 may be different types of electronic devices that provide different functions. In some embodiments, each semiconductor die 110 is a single System on a Chip (SoC) die, multiple SoC stacked dies, or the like. For example, FIG. 1B illustrates that the semiconductor die 110 is a SoC die, which includes a semiconductor substrate 1101, and multiple different electronic components 1102 (such as active devices and/or passive devices) mounted on the semiconductor substrate 1101. The electronic components 1102 may be electrically connected through the semiconductor substrate 1101 to form a functional integrated circuit, such as a processor, logic circuitry, memory, analog circuit, digital circuit, mixed signal circuit, or the like. A protective layer 1103 made of molding material (such as an epoxy-based resin) may be disposed on the semiconductor substrate 1101 to surround and protect the overlying electronic components 1102, in accordance with some embodiments.

In some embodiments, each semiconductor die 112 is a single memory die or a memory die stack. For example, FIG. 1B illustrates that the semiconductor dies 112 each is a memory die stack, which includes multiple stacked memory dies 1122 bonded to a logic die 1121 (sometimes called a base die). Each of the memory dies 1122 may include a static random access memory (SRAM) device, a dynamic random access memory (DRAM) device, a high bandwidth memory (HBM) device, or another type of memory device. A protective layer 1123 made of molding material (such as an epoxy-based resin) may also be formed to surround and protect the logic die 1121 and the memory dies 1122, in accordance with some embodiments.

Each of the semiconductor dies 110 and 112 can be obtained, for example, by sawing or dicing a semiconductor wafer (with several IC dies formed thereon) along scribed lines to separate the semiconductor wafer into a plurality of individual semiconductor dies. It should be appreciated that the above examples of semiconductor dies 110 and 112 are provided for illustrative purposes, and other semiconductor dies or chips having other functions may also be used in some alternative embodiments.

In various embodiments, the semiconductor dies 110 and 112 may have the same or different heights in a vertical direction (e.g., the direction Z shown in FIG. 1B), and/or the same or different sizes in a horizontal cross section perpendicular to the vertical direction.

After disposing the semiconductor dies 110 and 112 over the interposer substrate 102, they are bonded to the interposer substrate 102 through flip-chip bonding by way of conductive elements 107 on each semiconductor die 110/112 and conductive structures 108 on the interposer substrate 102 to form conductive joints, as shown in FIG. 1B, in accordance with some embodiments.

In some embodiments, the conductive elements 107, such as conductive pillars, may be formed on an active side (e.g., the lower surface shown in FIG. 1B) of each semiconductor die 110/112 at the exposed contact pads (not shown) before the bonding process. The conductive elements 107 may be made of or include copper, aluminum, gold, cobalt, titanium, tin, one or more other suitable materials, or a combination thereof. The conductive elements 107 may be formed using an electroplating process, an electroless plating process, a placement process, a printing process, a physical vapor deposition (PVD) process, a chemical vapor deposition (CVD) process, one or more other applicable processes, or a combination thereof.

In some embodiments, each of the conductive structures 108 includes a metal pillar 108A and a metal cap layer (such as a solder cap) 108B over the metal pillar 108A, as shown in FIG. 1B. The conductive structures 108 including the metal pillars 108A and the metal cap layers 108B are sometimes referred to as micro bumps. The conductive structures 108 may be formed on the first surface 102A of the interposer substrate 102 at the exposed contact pads (not shown) before the bonding process. The metal pillars 108A may include a conductive material such as copper, aluminum, gold, nickel, palladium, the like, or a combination thereof, and may be formed by sputtering, printing, electroplating, electroless plating, CVD, or the like. The metal pillars 108A may be solder-free and have substantially vertical sidewalls. In accordance with some embodiments, a metal cap layer 108B is formed on the top of a metal pillar 108A. The metal cap layers 108B may include nickel, tin, tin-lead, gold, copper, silver, palladium, indium, nickel-palladium-gold, nickel-gold, the like, or a combination thereof, and may be formed by a plating process such as an electroplating process.

One of ordinary skill in the art would appreciate that the above conductive structures 108 examples are provided for illustrative purposes, and other structures of the conductive structures 108 may also be used.

The bonding between the semiconductor dies 110 and 112 and the interposer substrate 102 may be solder bonding or direct metal-to-metal (such as a copper-to-copper) bonding, in accordance with some embodiments. In some embodiments, the semiconductor dies 110 and 112 are bonded to the interposer substrate 102 through a reflow process. During the reflow, the conductive joints (i.e., the conductive elements 107 and the conductive structures 108) are in contact with the exposed contact pads of the semiconductor dies 110 and 112 and the exposed contact pads (constructed by some conductive features 106) of the interposer substrate 102, respectively, to physically and electrically couple the semiconductor dies 110 and 112 to the interposer substrate 102.

In some embodiments, an underfill element 114 is formed over the interposer substrate 102 to surround and protect the conductive joints, and enhances the connection between the semiconductor dies 110 and 112 and the interposer substrate 102, as shown in FIG. 1B. The underfill element 114 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into the gap between each semiconductor die 110/112 and the interposer substrate 102 to reinforce the strength of the conductive joints and therefore the overall package structure. After the dispensing, the underfill material is cured to form the underfill element 114.

In some embodiments as shown in FIG. 1B, the underfill element 114 fills the whole gap between each semiconductor die 110/112 and the interposer substrate 102. Also, a portion of the underfill element 114 is in the gaps between adjacent semiconductor dies 110 and 112.

Figure 1C:
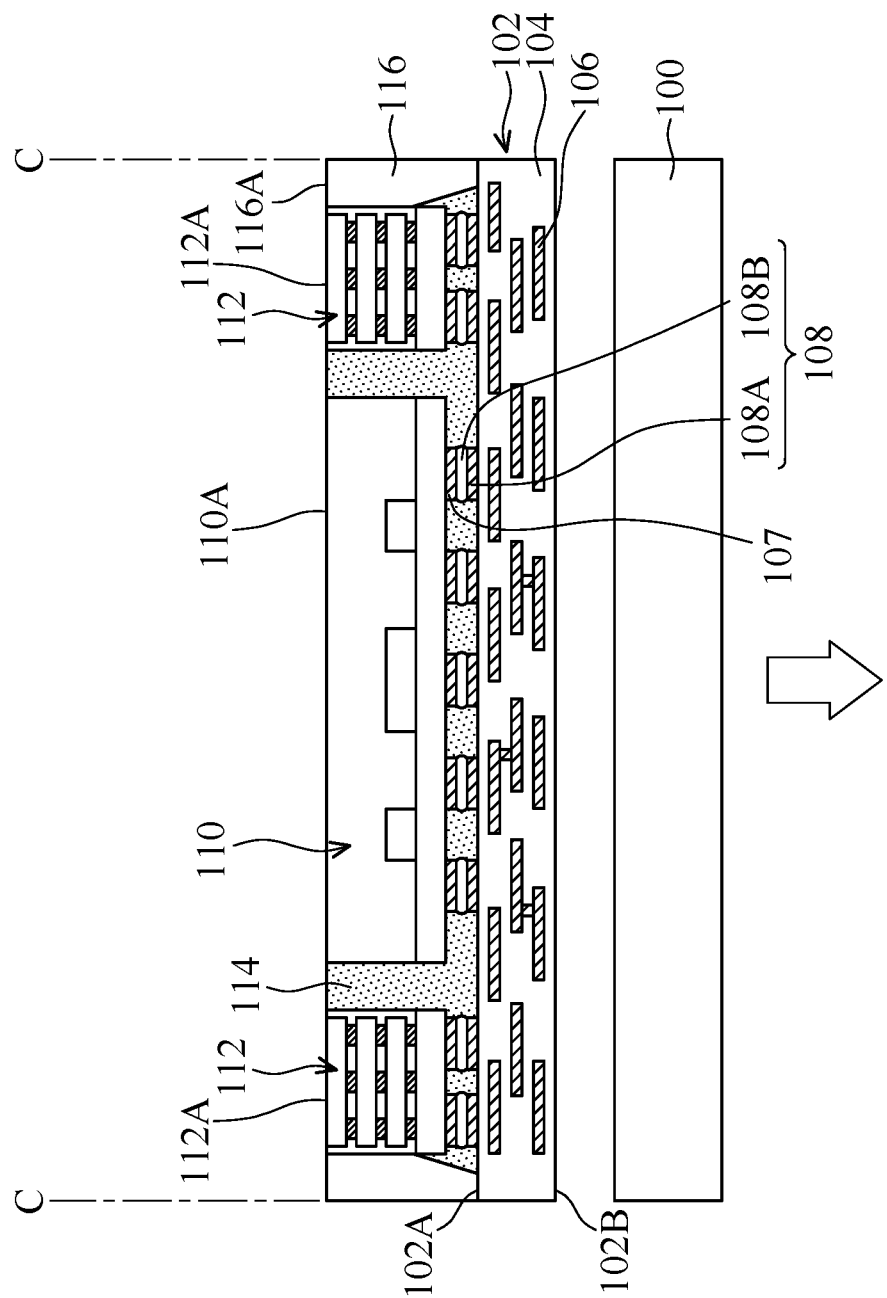

As shown in FIG. 1C, an encapsulant layer 116 is further formed over the interposer substrate 102 to surround and protect the semiconductor dies 110 and 112 and the underfill element 114. The encapsulant layer 116 may be separated from the conductive joints below the semiconductor dies 110 and 112 by the underfill element 114. In some embodiments, the encapsulant layer 116 is made of or includes an insulating material such as a molding material. The molding material may include a polymer material, such as an epoxy-based resin with fillers dispersed therein. In some embodiments, a molding material (such as a liquid molding material) is dispensed over the interposer substrate 102 and/or over the semiconductor dies 110 and 112. In some embodiments, a thermal process is then used to cure the liquid molding material and to transform it into the encapsulant layer 116.

In some embodiments, a planarization process (not shown) is further applied on the encapsulant layer 116 to partially remove the encapsulant layer 116, until the top surface 110A of each semiconductor die 110 and the top surface 112A of each semiconductor die 112 are exposed through the top surface 116A of the encapsulant layer 116. This facilitates the dissipation of heat generated from the semiconductor dies 110 and 112 during operation. The planarization process may include a grinding process, a chemical mechanical polishing (CMP) process, an etching process, a dry polishing process, one or more other applicable processes, or a combination thereof.

Afterwards, the carrier substrate 100 is removed to expose a second surface 102B (e.g., the shown lower surface) of the interposer substrate 102, as shown in FIG. 1C, in accordance with some embodiments. Although not shown, the remaining structure may be turned upside down and placed so that the semiconductor die side is affixed to a dicing tape (not shown). A singulation process (also referred to as a saw process) is then performed along cutting grooves C shown in FIG. 1C, to form multiple separate package structures, in accordance with some embodiments. In FIG. 1C, one of the package structures is shown, which includes an interposer substrate 102 with semiconductor dies 110 and 112, an underfill element 114 and an encapsulant layer 116 thereon. Afterwards, each package structure may be removed from the dicing tape (not shown) using, for example, a pick-and-place tool (not shown).

Figure 1D:
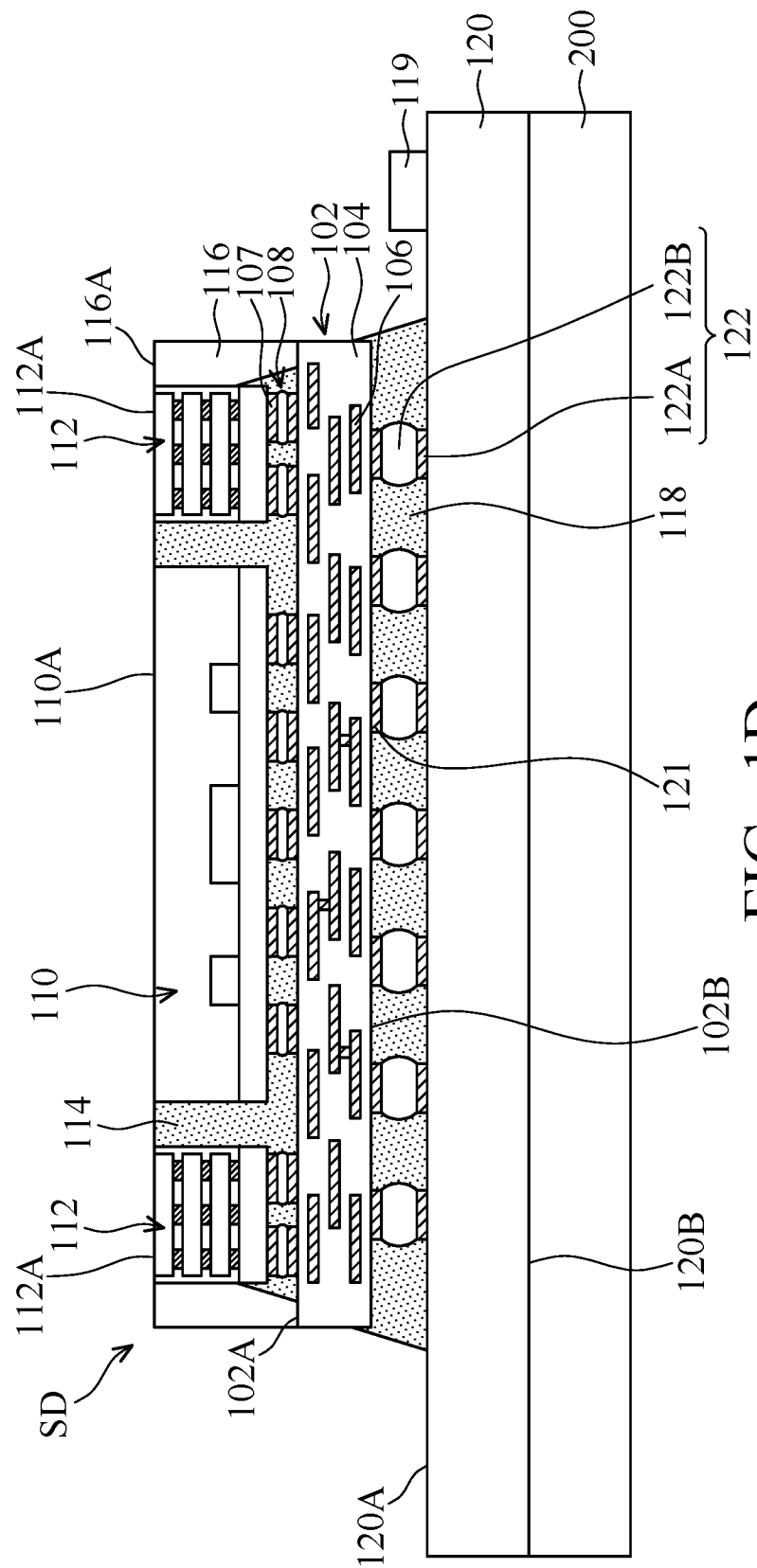

As shown in FIG. 1D, the resulting package structure in FIG. 1C (for illustration, hereinafter also referred to as a semiconductor device SD) is disposed (by a pick-and-place tool, for example) over a package substrate 120 placed on another carrier substrate 200 (similar to the carrier substrate 100 mentioned above) with the second surface 102B (e.g., the shown lower surface) of the interposer substrate 102 facing a first surface 120A (e.g., the shown upper surface) of the package substrate 120, in accordance with some embodiments. The respective process is illustrated as process 301 in the process flow 300 shown in FIG. 3. The package substrate 120 is used to provide electrical connection between semiconductor devices or components packaged in the package structure and an external electronic device, after the carrier substrate 200 is removed at a subsequent stage (which will be described later).

After stacking the interposer substrate 102 over the package substrate 120, it is bonded to the package substrate 120 through flip-chip bonding by way of conductive elements 121 (such as conductive pillars) formed on the second surface 102B of the interposer substrate 102 at the exposed contact pads (not shown) and conductive structures 122 (such as micro bumps each including a metal pillar 122A and a metal cap layer 122B over the metal pillar 122A) formed on the first surface 120A of the package substrate 120 at the exposed contact pads (not shown) to form conductive joints, in accordance with some embodiments. The bonding between the interposer substrate 102 and the package substrate 120 may be solder bonding or direct metal-to-metal (such as a copper-to-copper) bonding. In some embodiments, the interposer substrate 102 is bonded to the package substrate 120 through a reflow process, as previously discussed. The materials and formation method of the conductive elements 121 and the conductive structures 122 may be the same or similar to those of the conductive elements 107 and the conductive structures 108, respectively, illustrated in FIG. 1B, and are not repeated here.

The conductive joints (i.e., conductive elements 121 and the conductive structures 122) enable electrical connection between the interposer substrate 102 (as well as devices thereon) and the package substrate 120. In some embodiments, an underfill element 118 is also formed over the package substrate 120 to surround and protect the conductive joints, and enhances the connection between the interposer substrate 102 and the package substrate 120, as shown in FIG. 1D. The materials and formation method of the underfill element 118 may be the same or similar to those of the underfill element 114 illustrated in FIG. 1B, and are not repeated here.

In some embodiments as shown in FIG. 1D, one or more electronic components 119 (one electronic component 119 is shown for illustration) is also disposed over the package substrate 120. The electronic component 119 may be bonded onto the exposed contact pads (not shown) at the first surface 102A of the package substrate 120 through solder bumps, conductive pillars, one or more other suitable conductive elements, or a combination thereof. In some embodiments, the electronic component 119 is a surface mount device (SMD), and may include an active device (such as a transistor, a diode, or the like) or a passive device (such as a resistor, a capacitor, an inductor, or the like).

Figure 1E:
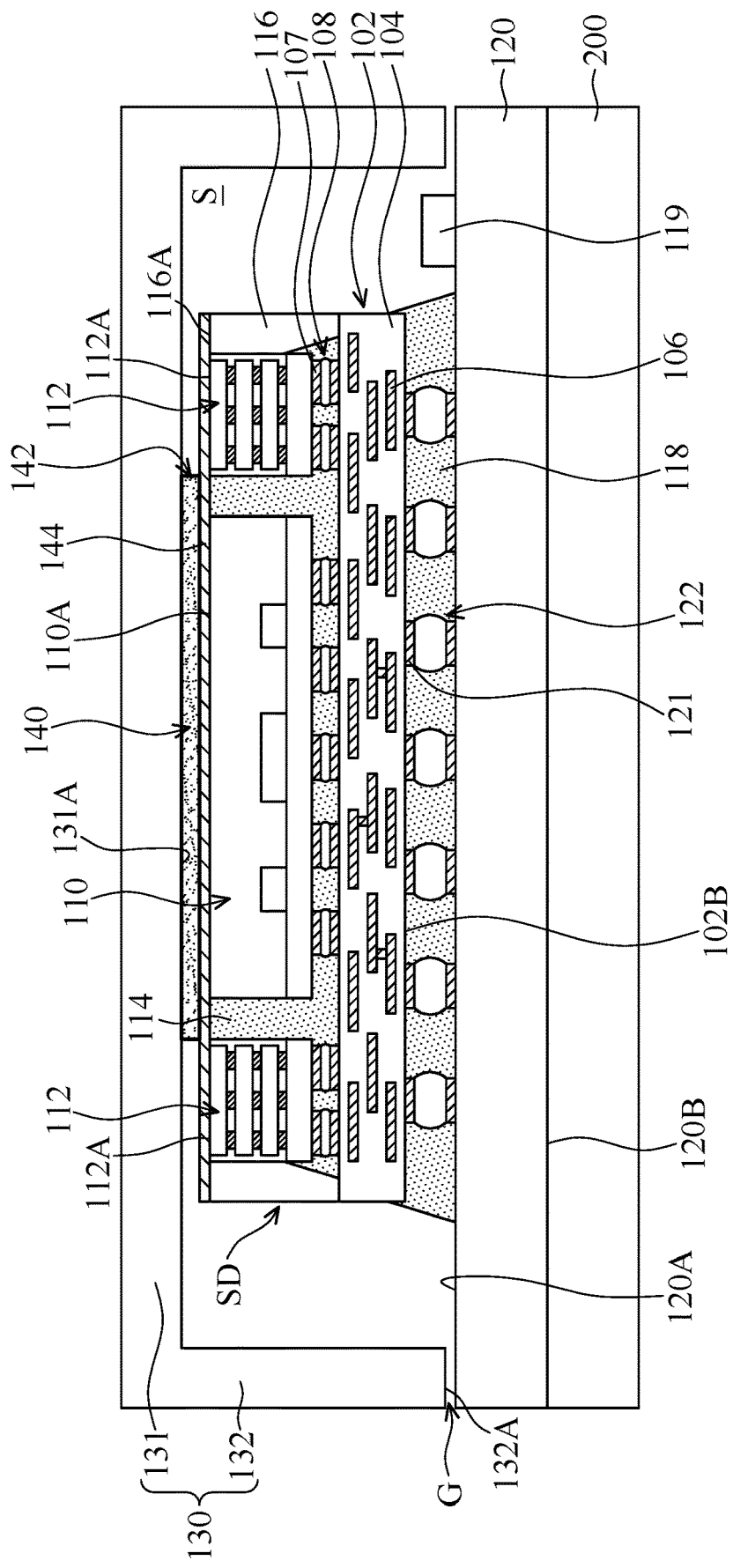

As shown in FIG. 1E, a metal lid 130 is placed on the package substrate 120, in accordance with some embodiments. The metal lid 130 may be placed over the semiconductor device SD and the package substrate 120 using, for example, a pick-and-place tool. The respective process is illustrated as process 302 in the process flow 300 shown in FIG. 3. The metal lid 130 may have a high thermal conductivity (Tk), for example, between about 200 W/m·K to about 400 W/m·K or more, and may be configured as a heat spreader for dispersing heat generated from devices in the package structure. In some embodiments, the metal lid 130 is formed using a metal, a metal alloy, or the like. For example, the material of metal lid 130 may include metals and/or metal alloys such as Al, Cu, Ni, Co, the like, or a combination thereof.

While not shown, the metal lid 130 may generally have a rectangular or square shape in the top view, depending on the top view shape of the package substrate 120. In some embodiments, the metal lid 130 includes a substantially flat cover portion 131 and a ring portion 132 extending from edges of the cover portion 131. After the metal lid 130 is placed on the package substrate 120, the cover portion 131 is located above the semiconductor device SD, and the ring portion 132 extends from the cover portion 131 toward the first surface 120A of the package substrate 120 and is arranged along edges of the package substrate 120 to surround the semiconductor device SD. As a result, the semiconductor device SD is accommodated in a space S formed between the cover portion 131 and the ring portion 132. In some embodiments as shown in FIG. 1E, a gap G is formed between the bottom surface 132A of the ring portion 132 and the first surface 120A of the package substrate 120, after the metal lid 130 is placed, so that the internal space S of metal lid 130 communicates with the external environment.

In some embodiments, a metal thermal interface material (TIM) 140 is provided to ensure good contact between the surfaces of metal lid 130 and semiconductor device SD, as shown in FIG. 1E. The metal TIM 140 may have a thermal conductivity higher than about 10 W/m·K. The metal TIM 140 with good thermal conductivity helps to dissipate heat from the semiconductor device SD to the heat dissipating metal lid 130.

The metal TIM 140 may be applied to the bottom surface 131A of the cover portion 131 of the metal lid 130 or may be applied over the top surface (for example, composed of the top surfaces of semiconductor die 110, semiconductor dies 112, underfill element 114, and encapsulant layer 116) of the semiconductor device SD using, for example, a PVD process or the like, before the installation of the metal lid 130. In some embodiments, the metal TIM 140 is a continuous layer or film (see FIG. 1E), but the disclosure is not limited. In some alternative embodiments, the metal TIM 140 may be a patterned or discontinuous layer. In some embodiments, the metal TIM 140 may be made of or include a high thermal conductivity material such as a solder-based material (e.g., indium paste) or other available metal materials.

In some embodiments, before the metal TIM 140 is provided between the metal lid 130 and the semiconductor device SD, a flux (liquid) layer 142 (see FIG. 1E) is further applied or coated on the surface (e.g., the top, bottom, and lateral surfaces) of metal TIM 140 to prevent oxidation of the metal TIM 140 in the subsequent bonding (soldering) process.

In some embodiments, a buffer layer 144 (see FIG. 1E) is also formed (e.g., deposited) on the top surface of the semiconductor device SD using, for example, a PVD process or the like, before the metal TIM 140 is provided over the top surface of the semiconductor device SD. In these cases, the metal TIM 140 can be formed by a plating process using the buffer layer 144 as a seed layer. In some embodiments, the buffer layer 144 may be made of or include nickel, titanium, aluminum, one or more other suitable materials, or a combination thereof, depending on the selected material of the metal TIM 140. In some embodiments, the buffer layer 144 includes multiple sub-layers.

In some embodiments, the metal TIM 140 is also configured as a bonding material for bonding the metal lid 130 to the top surface of the semiconductor device SD. Next, referring to FIGS. 1F-1I, which illustrate various stages of a novel metal lid attachment approach using the metal TIM 140 as the bonding material, in accordance with some embodiments.

Figure 1F:
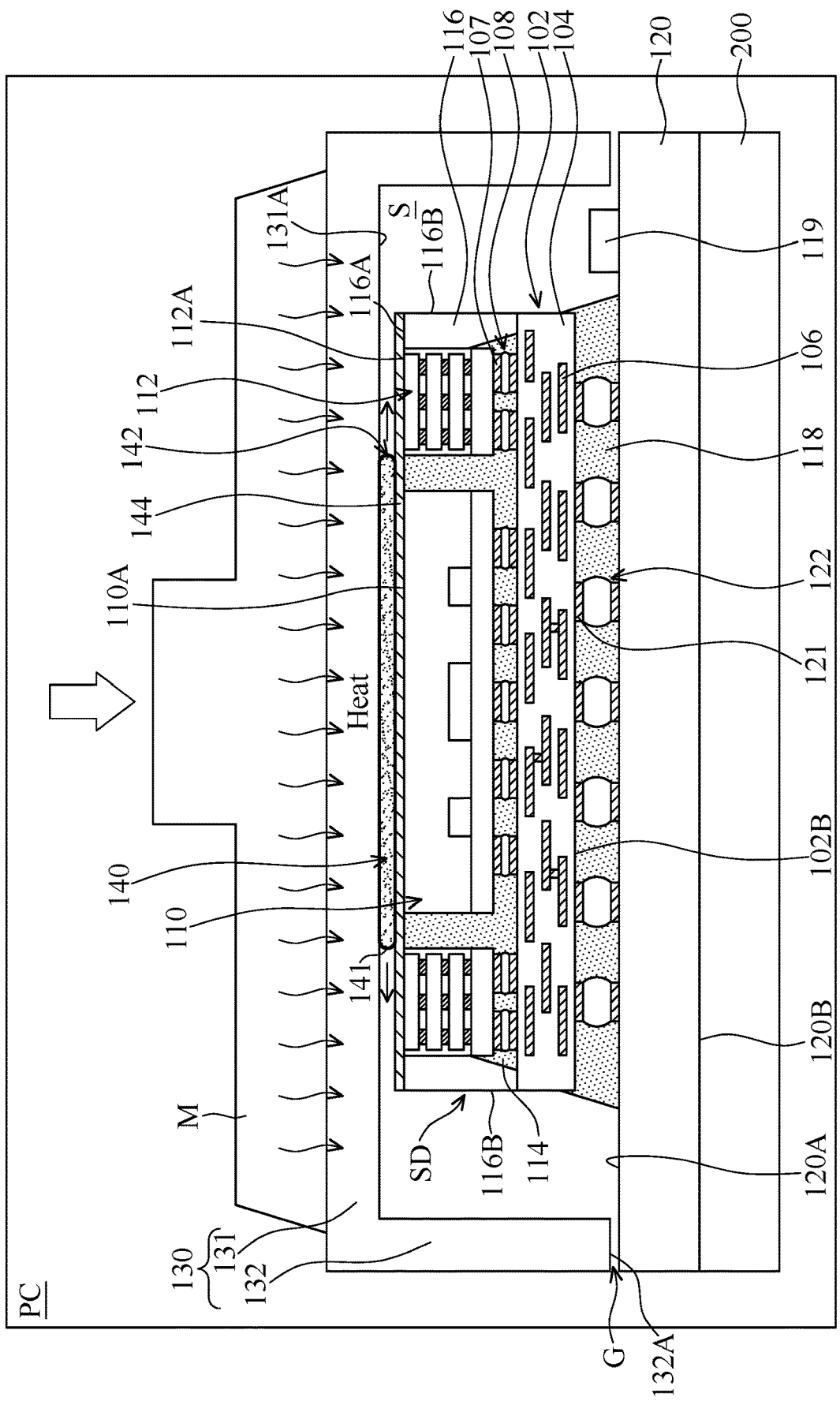

As shown in FIG. 1F, to perform the bonding process, the resulting structure shown in FIG. 1E is first placed into an enclosed processing chamber PC. Afterwards, the metal lid 130 is heated and pressed down (as indicated by the downward arrow in FIG. 1F) using a thermal compression bonding head M in the processing chamber PC. During the application of the heat and pressure to the metal lid 130, the metal TIM 140 starts melts and then flows toward the lateral edges (e.g., the lateral edges 116B of encapsulant layer 116) of the semiconductor device SD. The respective process is illustrated as process 303 and process 304 in the process flow 300 shown in FIG. 3. The processes 303 and 304 may be performed simultaneously, in accordance with some embodiments.

In some embodiments, the thermal compression bonding head M heats the metal TIM 140 to reach its melting point, for example, a temperature of about 150° C. to about 400° C. or more. In some embodiments, the pressure applied by the thermal compression bonding head M while pressing down the metal lid 130 ranges from about 50 kPa to about MPa or more. It should be understood that the heat and pressure applied by the thermal compression bonding head M can vary according to different selected materials of the metal TIM 140, and are not limited to the above examples.

Figure 1G:
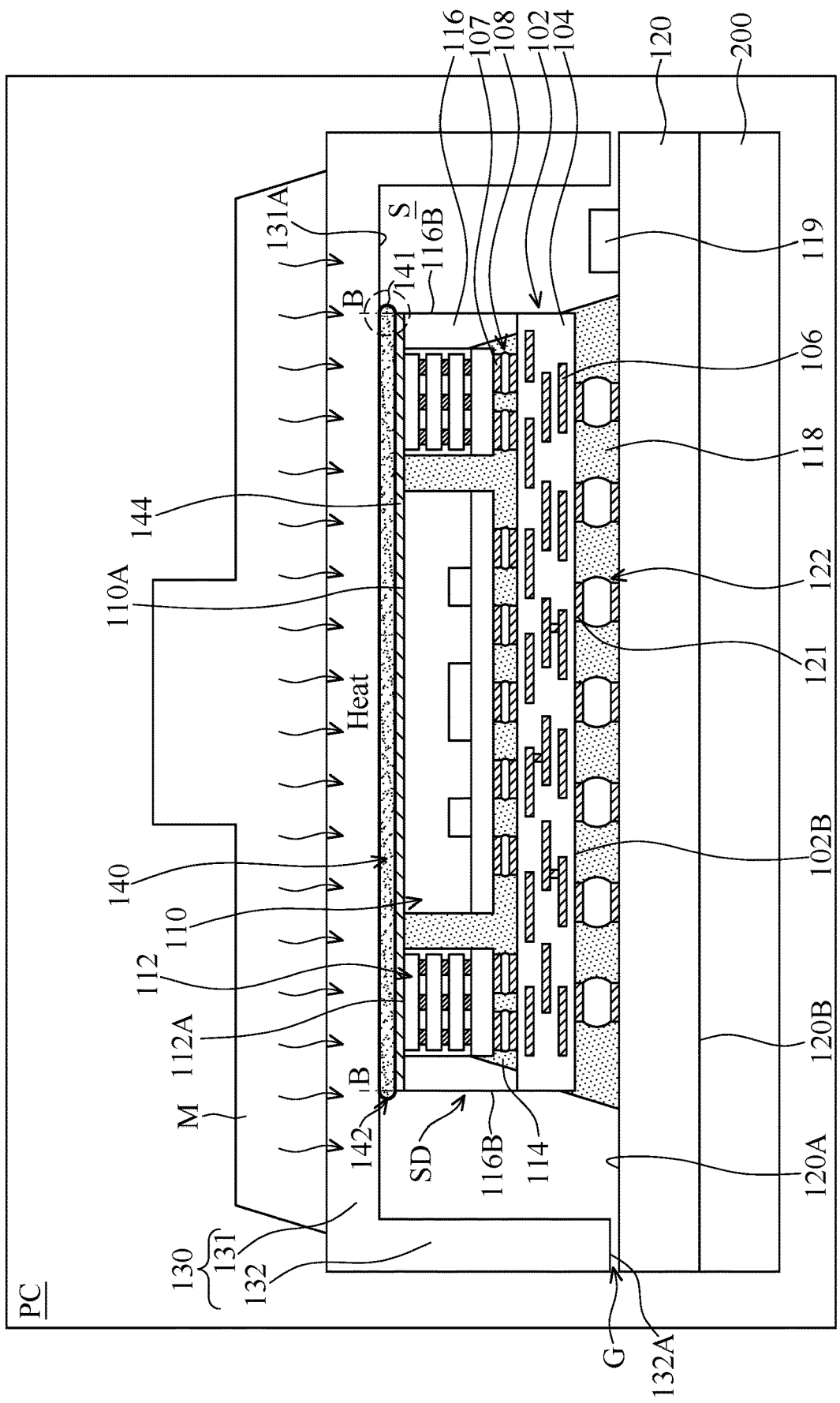
Figures 1, 1G:
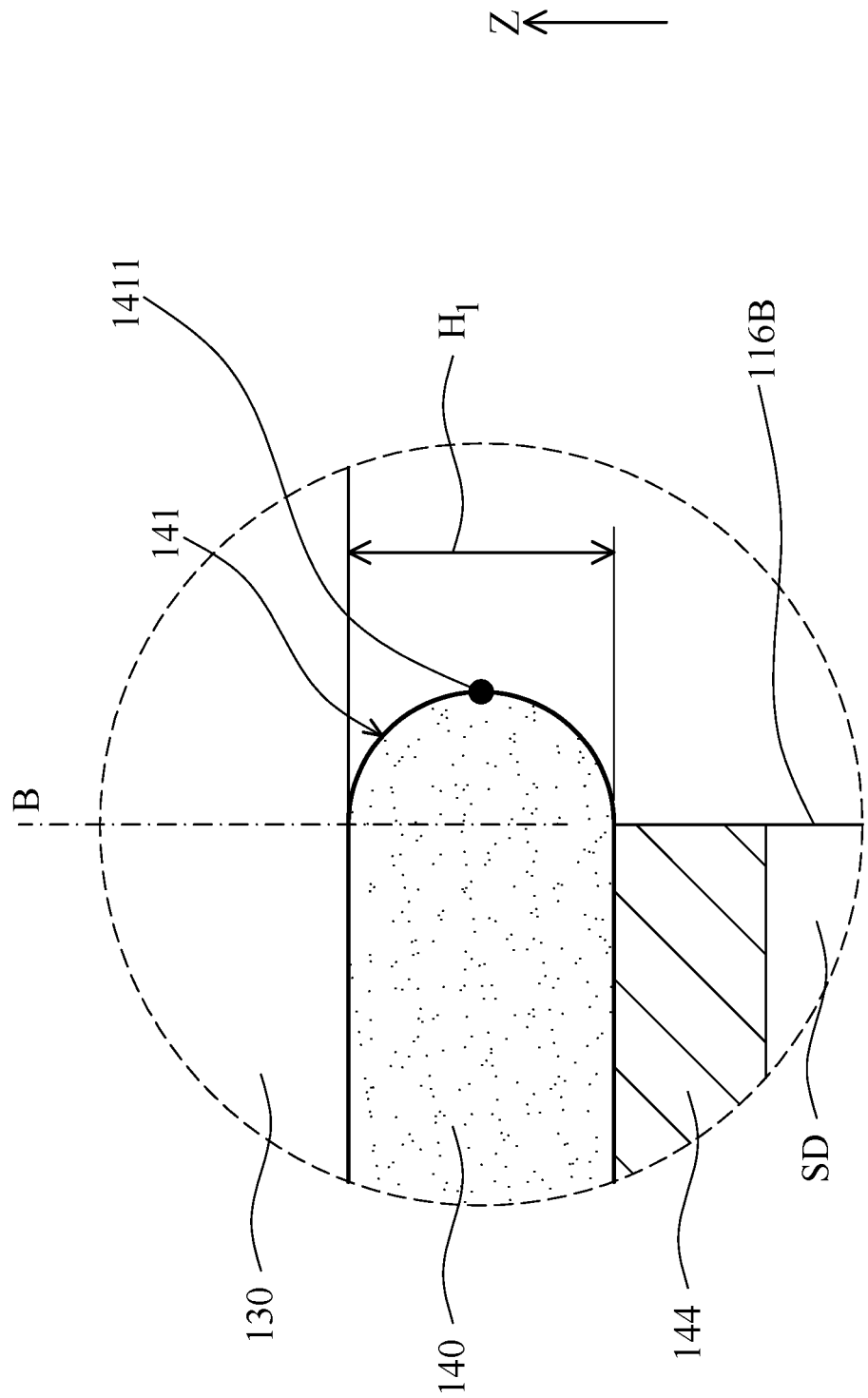

In some embodiments, when the metal lid 130 is pressed, the shape of the lateral sidewall 141 of the molten metal TIM 140 is a convex arc, as shown in FIG. 1F. In some embodiments, the thermal compression bonding head M continuously provides heat and downward pressure to the metal lid 130, until the outermost point 1411 of the (convex arc shaped) lateral sidewall 141 of the molten metal TIM 140 extends beyond the boundary B (i.e., the lateral edge 116B) of the semiconductor device SD, as shown in FIG. 1G and FIG. 1G-1. This helps to prevent or reduce the formation of bubbles or voids in the molten metal TIM 140. The metal TIM 140 with fewer voids can have better thermal conductivity.

In some embodiments, after the molten metal TIM 140 reaches the above position as shown in FIG. 1G and FIG. 1G-1, the thermal compression bonding head M stops pressing the metal lid 130 downward (but still continues to apply heat). Afterwards, the thermal compression bonding head M starts to move upward (as indicated by the upward arrow in FIG. 1H), for example, driven by a driving mechanism (e.g., a motor, not shown), in accordance with some embodiments. As the thermal compression bonding head M is lifted, the pressure exerted on the metal lid 130 gradually decreases, so that the molten metal TIM 140 flows back. The respective process is illustrated as process 305 in the process flow 300 shown in FIG. 3. In some embodiments, the thermal compression bonding head M can use a vacuum or other suitable clamping mechanism to clamp the metal lid 130 during the upward movement.

In some embodiments, the thermal compression bonding head M continuously provides heat and lifting force to the metal lid 130, until the molten metal TIM 140 flows back and the outermost point of the lateral sidewall 141 of the molten metal TIM 140 is within (i.e., does not exceed) the boundary B of the semiconductor device SD.

Figure 1H:
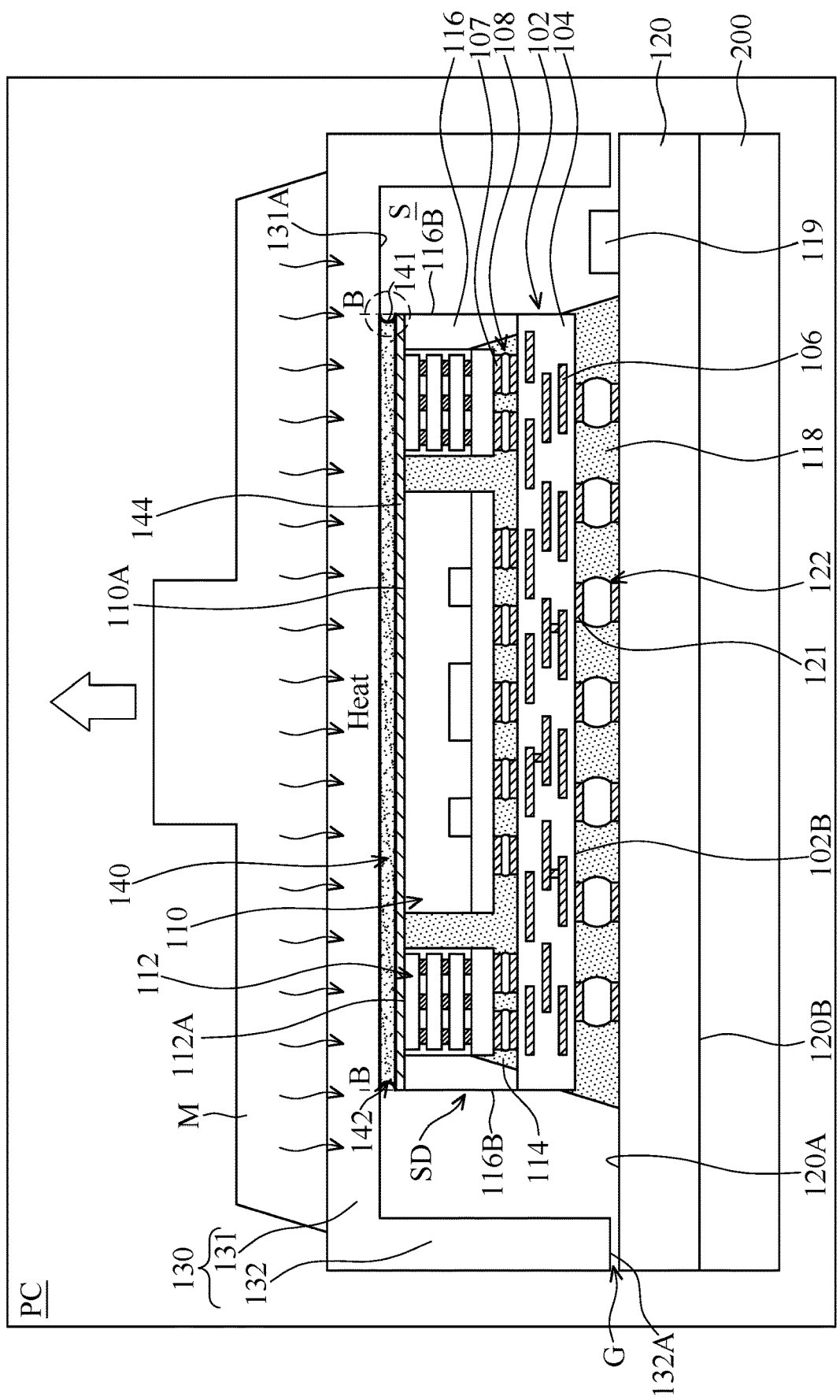
Figures 1, 1H:
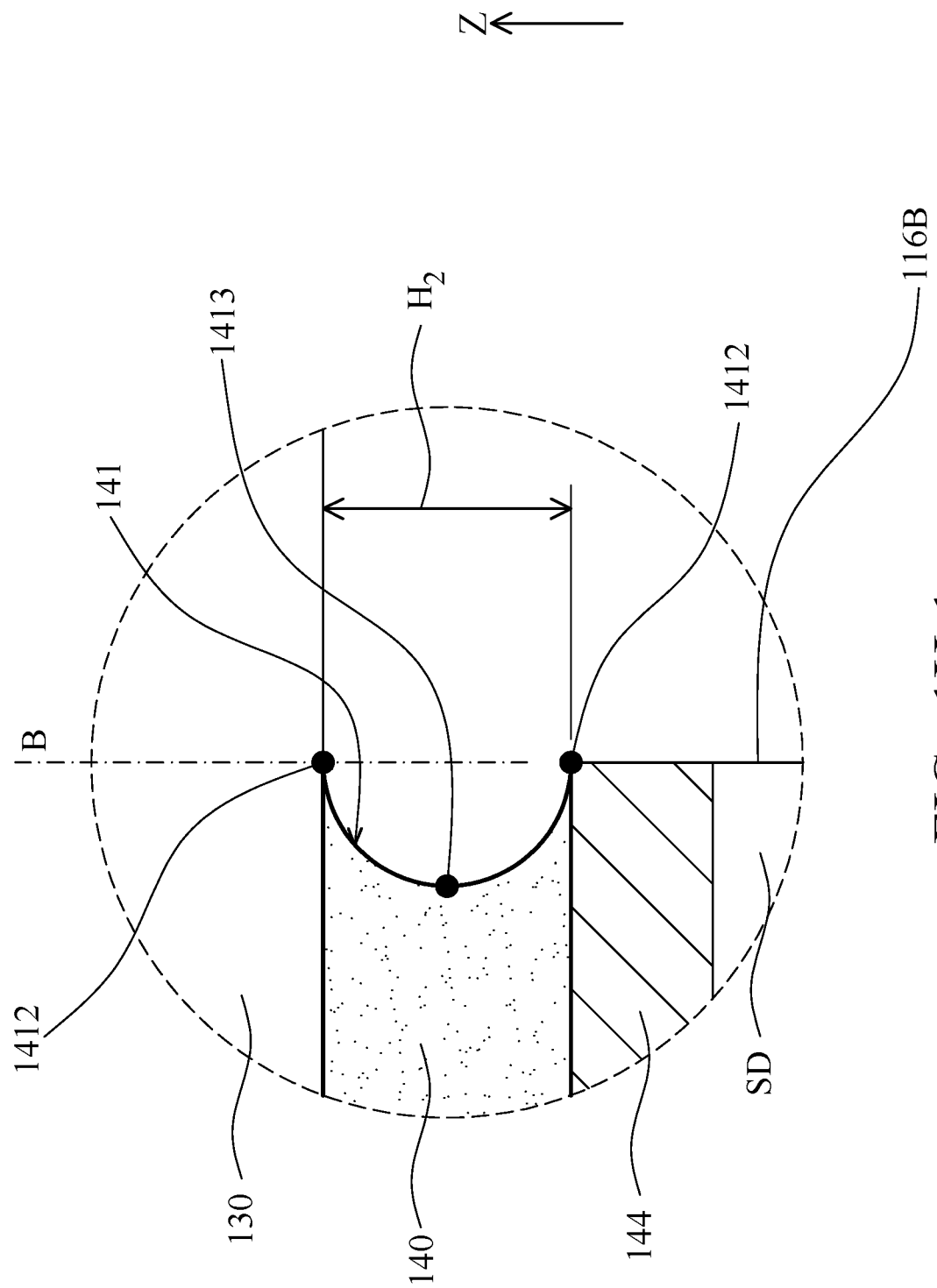

For example, in some embodiments, the thermal compression bonding head M continuously lifts the metal lid 130 upward, until the shape of the lateral sidewall 141 of the molten metal TIM 140 changes from a convex arc (see FIG. 1G) to a concave arc, as shown in FIG. 1H and FIG. 1H-1. In FIG. 1H-1, the (concave arc shaped) lateral sidewall 141 of the molten metal TIM 140 has two relatively outward end points 1412 and an intermediate point 1413 between the two end points 1412. The two end points 1412 are connected to the metal lid 130 and the semiconductor device SD, respectively, and are closer to a lateral edge 116B of the semiconductor device SD than the intermediate point 1413 in the lateral direction (e.g., perpendicular to the vertical direction Z). Therefore, in this case, the two end points 1412 are the outermost point(s) of the lateral sidewall 141. In FIG. 1H and FIG. 1H-1, when the shape of the lateral sidewall 141 of the molten metal TIM 140 becomes a concave arc and its two end points 1412 (the outermost point(s)) are aligned with the lateral edge 116B (the boundary B) of the semiconductor device SD, the thermal compression bonding head M stops lifting the metal lid 130 upward.

In some embodiments, after the pressing of the metal lid 130 and before the metal lid 130 is lifted (see FIG. 1G and FIG. 1G-1), the molten metal TIM 140 has a first thickness $H_1$ from its top surface to its bottom surface in the vertical direction Z. After lifting the metal lid 130 (see FIG. 1H and FIG. 1H-1), the molten metal TIM 140 has a second thickness $H_2$ from its top surface to its bottom surface in the vertical direction Z, and the second thickness $H_2$ is greater than the first thickness $H_1$.

As discussed above, through the upward movement of the metal lid 130 during the bonding process, the thickness and lateral sidewall shape of the metal TIM 140 can be changed. It should be understood that the metal TIM 140 with a concave-arc lateral sidewall shape (FIG. 1H and FIG. 1H-1) has a better stress absorbing ability compared with the convex-arc lateral sidewall shape, and therefore it helps to reduce (or release) the stress exerted on the interfaces of the metal TIM 140 (for example, the interface between the metal TIM 140 and the overlying metal lid 130, and the interface between the metal TIM 140 and the underlying semiconductor device SD), for example, during thermal cycling. As a result, the risk of metal TIM delamination is reduced, and the reliability of the entire package is improved.

Many variations and/or modifications can be made to embodiments of the disclosure. For example, FIGS. 1H-2, 1H-3, and 1H-4 show different shapes or positions of the lateral sidewall 141 of the molten metal TIM 140 after the metal lid 130 is lifted (i.e., after the thermal compression bonding head M stops lifting the metal lid 130), in accordance with some other embodiments. It should be understood that different stopping positions and/or different lifting speeds of the metal lid 130 can affect the shape and/or position of the lateral sidewall 141 of the molten metal TIM 140.

Figures 1, 1H, 2:
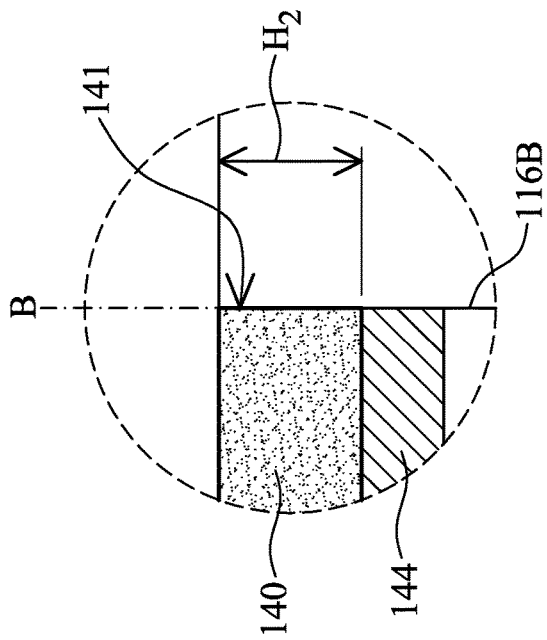
Figures 1, 1H, 2, 3:
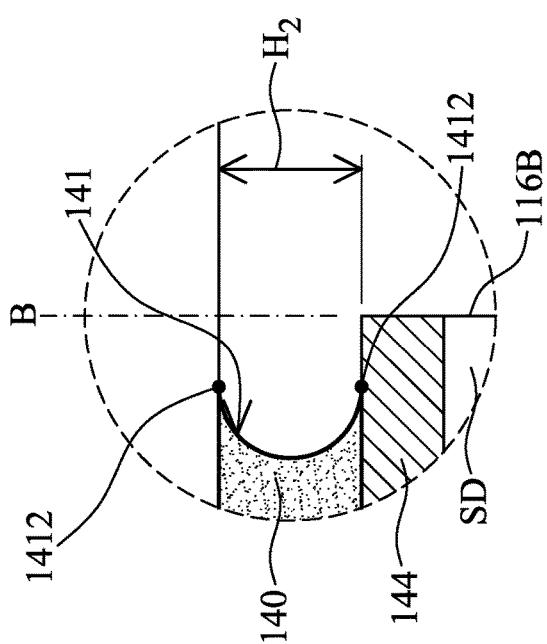
Figures 1, 1H, 2, 3, 4:
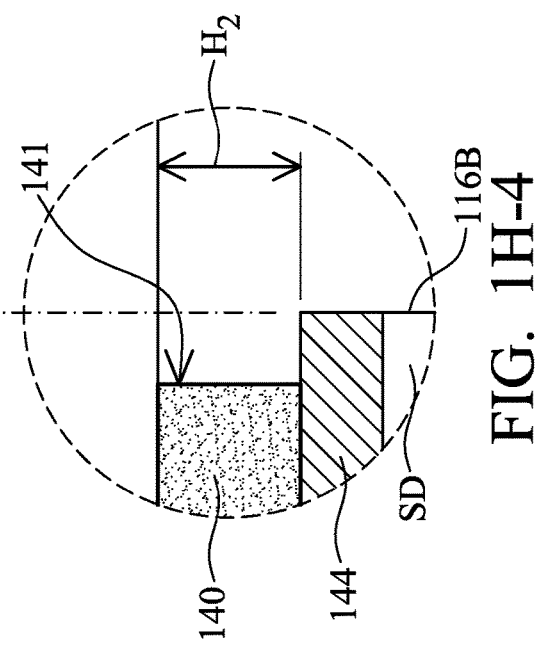

In FIG. 1H-2, after lifting the metal lid 130, the lateral sidewall 141 of the molten metal TIM 140 has a concave arc shape, and the two end points 1412 (the outermost point(s)) are offset from the lateral edge 116B of the semiconductor device SD toward the center of the top surface of the semiconductor device SD (i.e., they are closer to the center of the semiconductor device SD than the lateral edge 116B of the semiconductor device SD in the lateral direction). In FIG. 1H-3 and FIG. 1H-4, after lifting the metal lid 130, the lateral sidewall 141 of the molten metal TIM 140 has a straight (vertical linear) shape, and (the outermost point of) the lateral sidewall 141 of the molten metal TIM 140 is aligned with the lateral edge 116B of the semiconductor device SD, or offset from the lateral edge 116B of the semiconductor device SD toward the center of the top surface of the semiconductor device SD. The metal TIM 140 with a straight lateral sidewall shape also has a better stress absorbing ability compared with the convex-arc lateral sidewall shape, thereby reducing (or releasing) the stress exerted on the interfaces of the metal TIM 140, for example, during thermal cycling. In some other embodiments, after lifting the metal lid 130, the lateral sidewall 141 of the molten metal TIM 140 may also be non-linear.

Figure 1I:
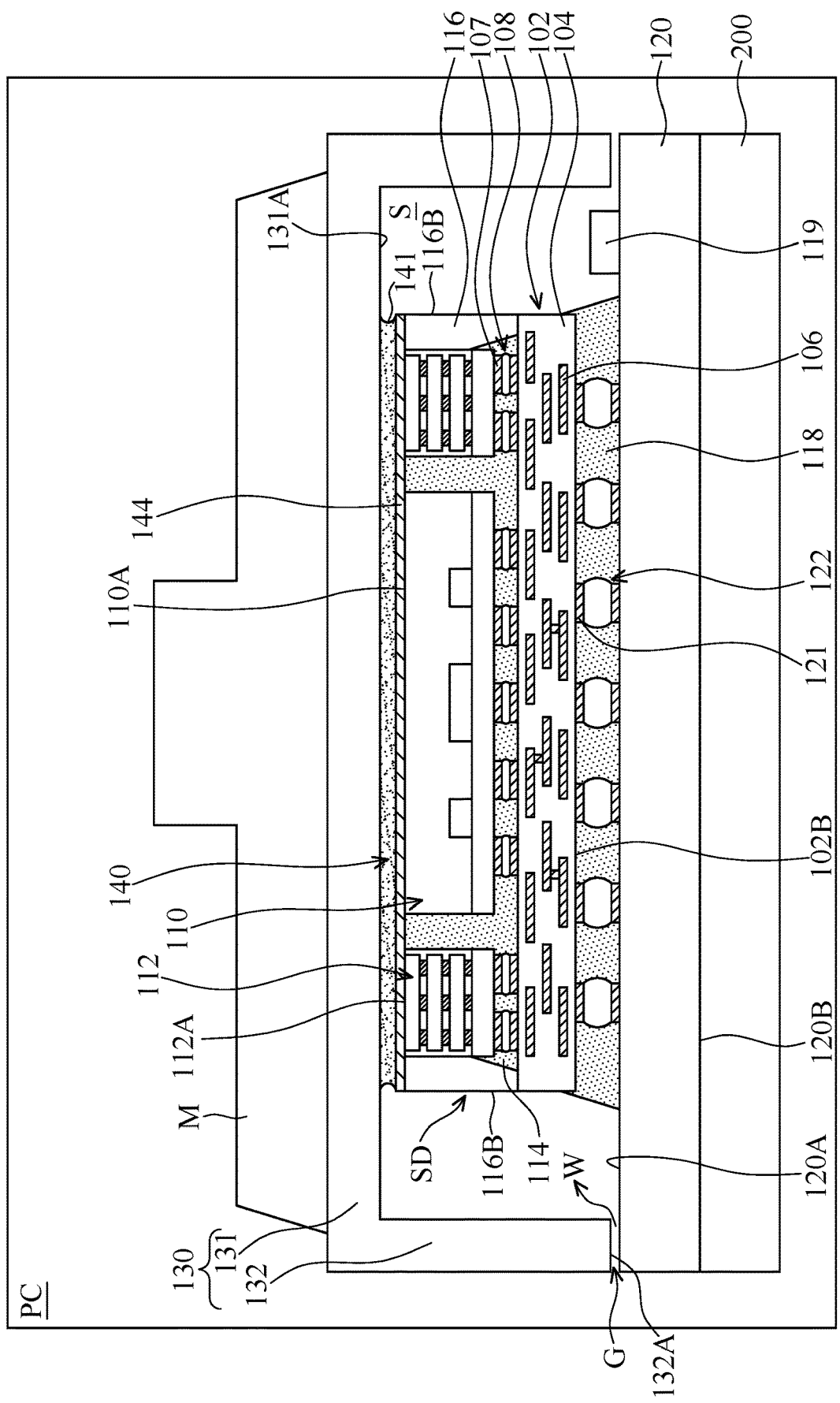

Next, referring to FIG. 1I. In FIG. 1I, after the molten metal TIM 140 reaches the above position and has the above lateral sidewall shape as shown in FIG. 1H, the thermal compression bonding head M stops applying heat to the metal lid 130. Then, after a period of time, the molten metal TIM 140 is cooled (for example, to a temperature below its melting point) and cured, and the metal lid 130 can be bonded (for example, by solder bonding) to the semiconductor device SD through the cured metal TIM 140. The respective process is illustrated as process 306 in the process flow 300 shown in FIG. 3. In addition, the thermal compression bonding head M releases and leaves the metal lid 130 after the solidification of the metal TIM 140, in accordance with some embodiments.

In some embodiments, the above process 303, process 304, process 305, and process 306 are (in-situ) performed in the same processing chamber PC. In some embodiments, during the process 303, process 304, process 305, and process 306, the processing chamber PC is filled with inert gas (such as nitrogen). This helps prevent the metal TIM 140 from being oxidized during the above-mentioned bonding (soldering) process, and can also reduce the use of the flux layer 142 (illustrated in FIG. 1E).

In some embodiments, because there is no thermal compression bonding process (for example, using an adhesive layer to attach the metal lid 130 to the package substrate 120) performed in another oven before the (metal TIM) bonding process, the short Q-time control issue (about the need to keep the flux layer 142 active during the soldering process) in traditional metal TIM applications can be solved.

In some embodiments, after the metal lid 130 is bonded to the semiconductor device SD through the metal TIM 140, a cleaning fluid W (such as deionized water or solvent) is further provided into the space S between the metal lid 130 and the package substrate 120 through the gap G (formed between the bottom surface 132A of the ring portion 132 and the first surface 120A of the package substrate 120) to remove a residue of the flux layer 142. The respective process is illustrated as process 307 in the process flow 300 shown in FIG. 3. In some other embodiments, the process 307 may also be omitted if there is no problem of flux residue.

Figure 1J:
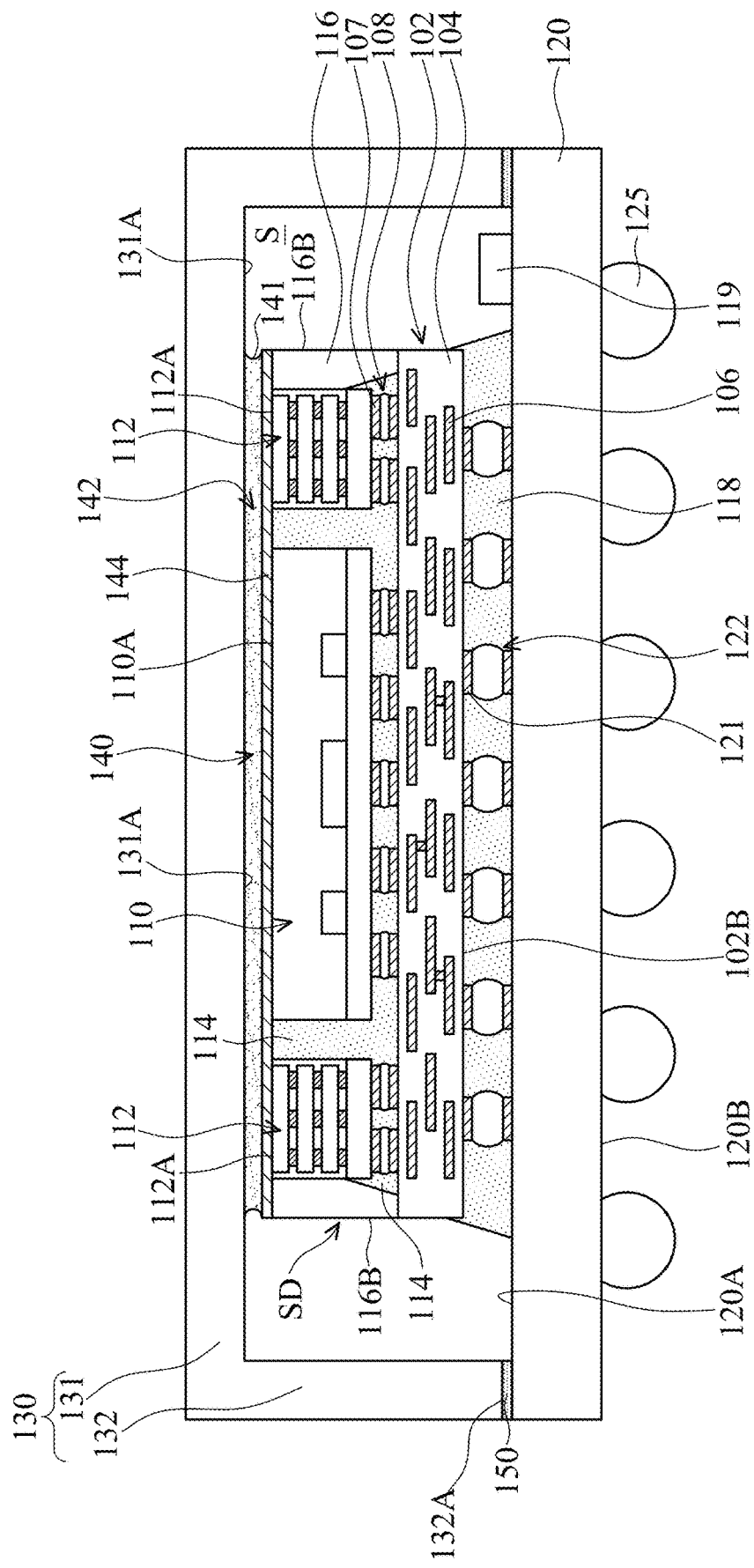
Figure 2:
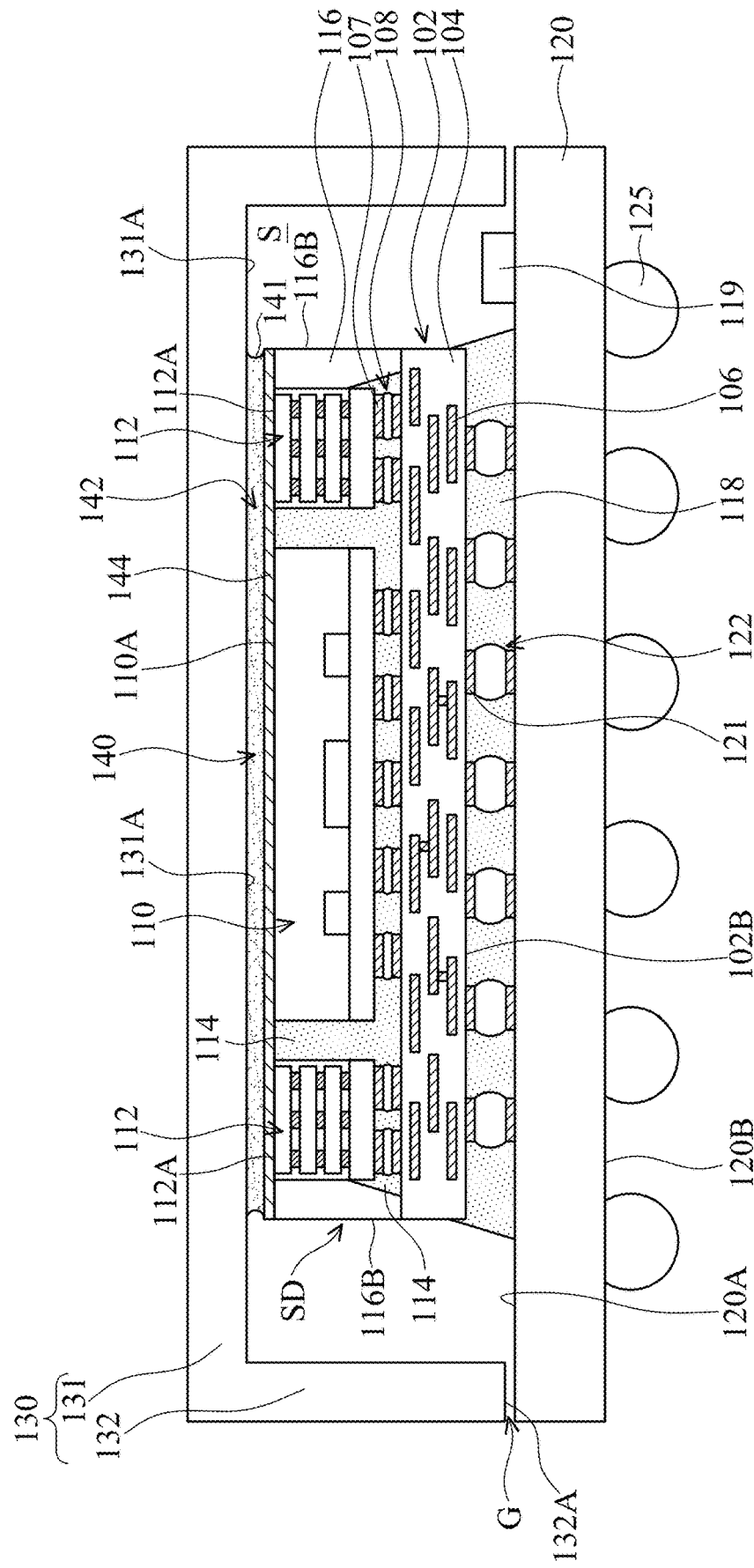
Figure 3:
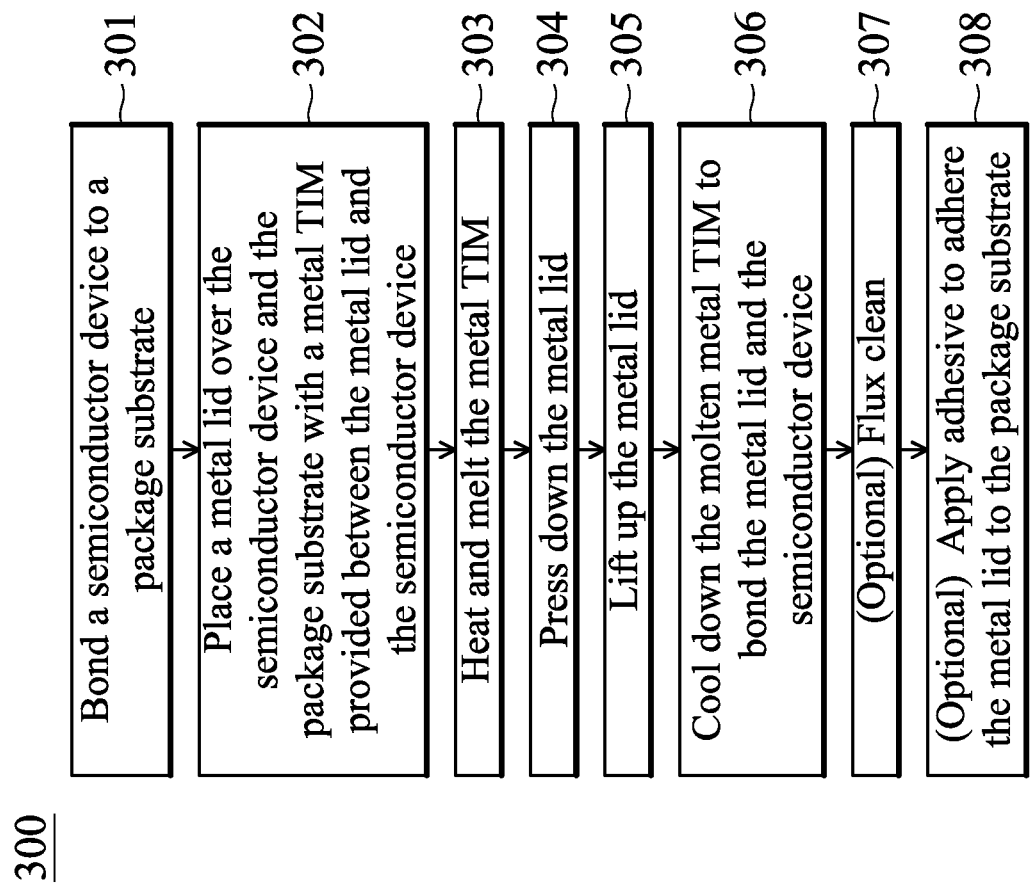

Afterwards, the resulting package structure in FIG. 1I is removed from the processing chamber PC, and then the carrier substrate 200 (in FIG. 1I) is removed to expose a second surface 120B (e.g., the shown lower surface) of the package substrate 120, in accordance with some embodiments. In some embodiments, conductive bumps 125 are then formed over the second surface 120B that is originally covered by the carrier substrate 200, as shown in FIG. 1J. Each conductive bump 125 may be electrically connected to one of the exposed contact pads (not shown) of the package substrate 120. The conductive bumps 125 enable electrical connection between the package substrate 120 and an external electronic device such as a PCB (not shown). The conductive bumps 125 may be or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed contact pads of the second surface 120B after the removal of the carrier substrate 200. A reflow process is then carried out to melt the solder balls into the conductive bumps 125. In some other embodiments, under bump metallization (UBM) elements are formed over the exposed contact pads before the solder balls are disposed. In some other embodiments, solder elements are electroplated onto the exposed contact pads. Afterwards, a reflow process is used to melt the solder element to form the conductive bumps 125.

In some embodiments as shown in FIG. 1J, after the resulting package structure in FIG. 1I is removed from the processing chamber PC (and/or after the removal or cleaning of the flux layer 142), an adhesive layer 150 is further formed between the bottom surface 132A of the ring portion 132 of the metal lid 130 and the first surface 120A of the package substrate 120, for example, by applying adhesive (glue) to the gap G (see FIG. 1I) and curing the adhesive (e.g., by ultraviolet (UV) light). The respective process is illustrated as process 308 in the process flow 300 shown in FIG. 3. The adhesive layer 150 helps to adhere the metal lid 130 to the package substrate 120, and also prevents foreign matter from entering the internal space of the package structure.

However, in some other embodiments as shown in FIG. 2, the adhesive layer 150 may also be omitted because the metal lid 130 has been bonded (fixed) to the semiconductor device SD through the metal TIM 140.

In some different embodiments, an adhesive layer 150 may be applied to the bottom surface 132A of the ring portion 132 of the metal lid 130 or applied to the first surface 120A of the package substrate 120, before the installation of the metal lid 130. In these cases, the adhesive layer 150 can help to attach the metal lid 130 to the package substrate 120 during the soldering process of the metal TIM 140 illustrated in FIGS. 1F—1I. In some embodiments, adhesive layer 150 may be applied to the bottom surface 132A of the ring portion 132 of the metal lid 130 or applied to the first surface 120A of the package substrate 120 during the process of applying the metal TIM 140.

As a result, the process for forming the resulting semiconductor device package, which includes a Chip-on-Wafer-on-Substrate (CoWoS) package structure, illustrated in FIG. 1J (and FIG. 2) is completed.

Figure 4A:
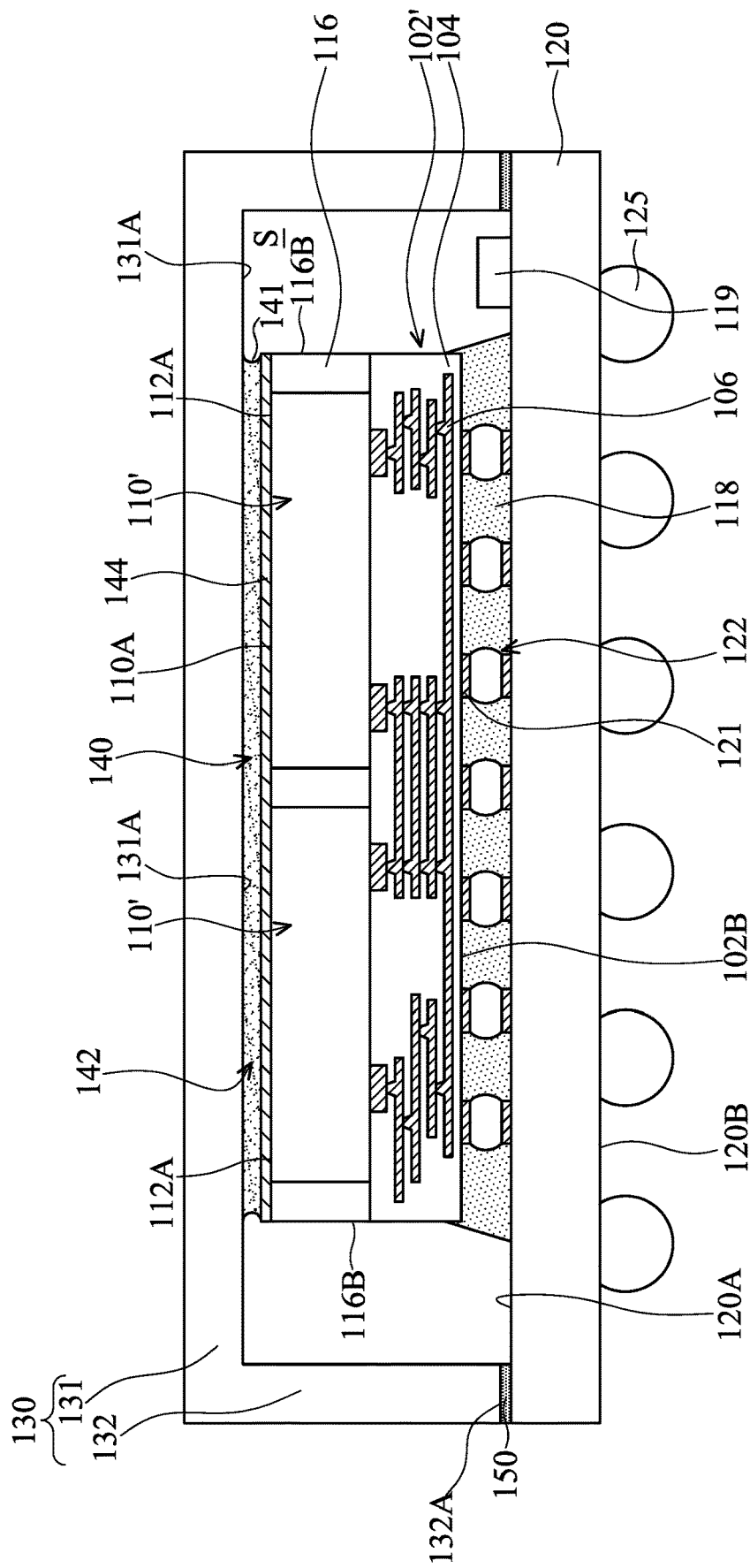
FIG. 4A is a schematic cross-sectional view of a semiconductor device package in accordance with some other embodiments.
Figure 4B:
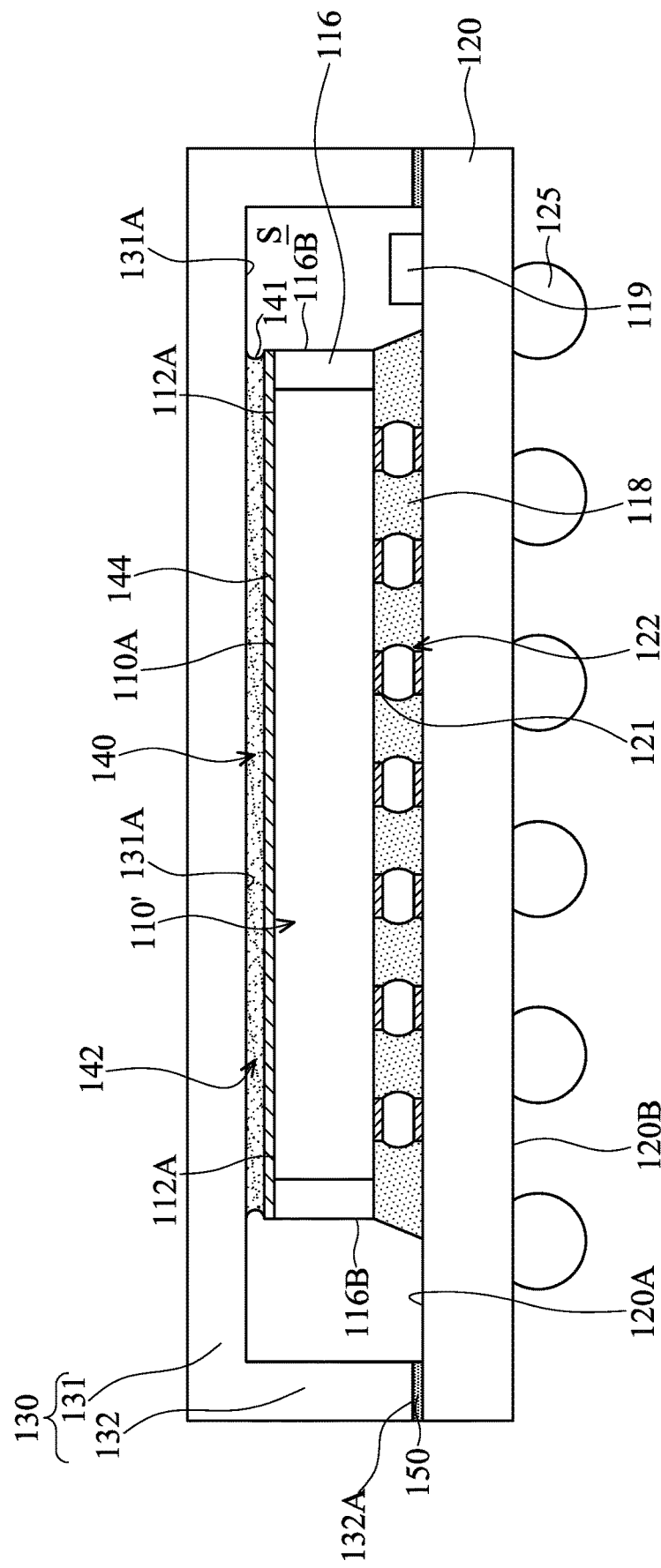
FIG. 4B is a schematic cross-sectional view of a semiconductor device package in accordance with some other embodiments.

It should be understood that the above manufacturing process (in particular, the metal lid attachment approach) can also be applied to other package structures. For example, in some embodiments as shown in FIG. 4A, the formed package structure (using the above manufacturing process) includes an integrated fan-out (InFo) package structure, and an InFo substrate (such as a redistribution line (RDL) substrate) 102' is used to couple to several semiconductor dies 110' (similar to the semiconductor dies 110 or 112 discussed above). In addition, in some embodiments of the formed package structure (using the above manufacturing process) as shown in FIG. 4B, the interposer substrate 102 can be omitted, and one or more semiconductor dies 110' (similar to the semiconductor dies 110 or 112 discussed above) is directly bonded to the package substrate 120.

Figure 5:
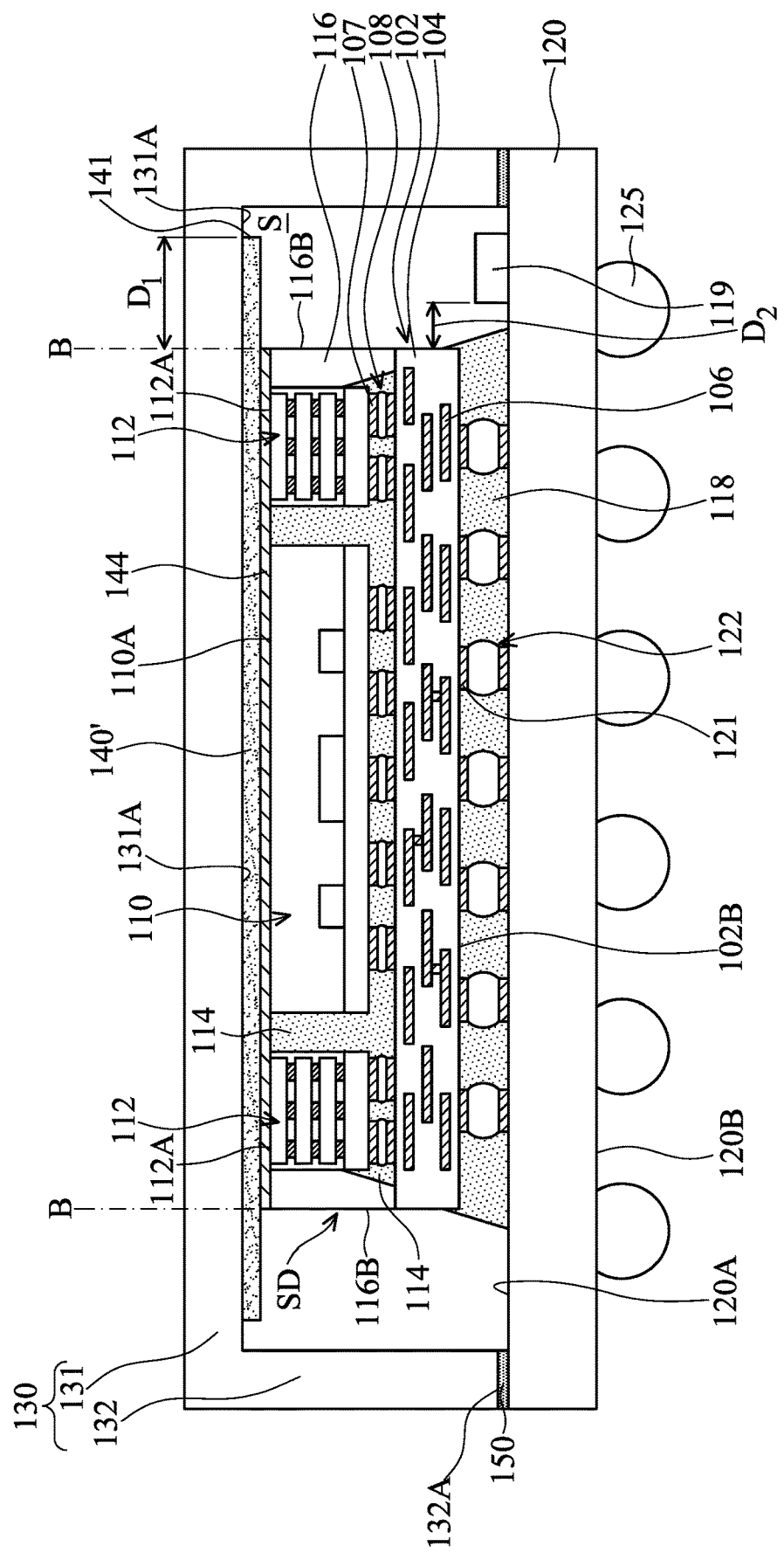
FIG. 5 is a schematic cross-sectional view of a semiconductor device package in accordance with some other embodiments.

FIG. 5 is a schematic cross-sectional view of a semiconductor device package in accordance with some other embodiments. In FIG. 5, a metal TIM 140' having a larger plane size (compared to the metal TIM 140 illustrated in FIGS. 1A-1J and 2) is used. For example, after the metal lid 130 is bonded or attached to the semiconductor device SD through the metal TIM 140', the metal TIM 140' may extend beyond the boundary B of the semiconductor device SD and across the electronic component 119 mounted on the package substrate 120. In some embodiments, the distance $D_1$ between the lateral sidewall 141 of the metal TIM 140' and the boundary B of the semiconductor device SD in the lateral direction (e.g., perpendicular to the vertical direction Z) is greater than the distance $D_2$ between the electronic component 119 and the boundary B of the semiconductor device SD in the lateral direction. Because the metal TIM 140' generally has good heat conduction characteristics in the lateral direction, the metal TIM 140' with a larger plane size helps to quickly spread heat from the semiconductor device SD to the heat dissipating metal lid 130.

In some embodiments, during assembly, the metal TIM 140' (film or layer form) can be placed on the bottom surface 131A of the cover portion 131 of the metal lid 130 first, and then the metal lid 130 can be directly attached or installed onto the package substrate 120 through the adhesive layer 150. Accordingly, the metal TIM 140' is interposed between the metal lid 130 and the top surface of the semiconductor device SD to help dissipate heat. The thickness and lateral sidewall shape of the metal TIM 140' can also be changed or controlled using the process illustrated in FIG. 1.

As mentioned above, a novel metal lid attachment approach is provided in accordance with some embodiments of the disclosure. The attachment approach utilizes a thermal compression bonding head to apply downward pressure and lifting force to the metal lid during the bonding (soldering) process of the metal TIM, to change or control the thickness and lateral sidewall shape of the metal TIM, thereby reducing the stress on the metal TIM and the risk of TIM delamination, for example, during thermal cycling. Accordingly, the reliability of the entire package is improved. In some embodiments, the metal lid can be directly bonded to the semiconductor device on the package substrate through the metal TIM, so an adhesive layer for attaching the metal lid to the package substrate can be omitted. As a result, the cost is reduced.

In accordance with some embodiments, a semiconductor device package is provided, including a package substrate, a semiconductor device, a metal lid, and a metal thermal interface material (TIM). The package substrate has a first surface. The semiconductor device is disposed over the first surface of the package substrate. The metal lid is disposed over the semiconductor device and the package substrate. The metal TIM is interposed between the metal lid and the top surface of the semiconductor device for bonding the metal lid and the semiconductor device. A shape of the lateral sidewall of the metal TIM in a longitudinal section is concave arc, and the outermost point of the lateral sidewall is within the boundary of the semiconductor device.

In accordance with some embodiments, a semiconductor device package is provided, including a package substrate, a semiconductor device, a metal lid, and a metal thermal interface material (TIM). The package substrate has a first surface. The semiconductor device is disposed over the first surface of the package substrate. The metal lid is disposed over the semiconductor device and the package substrate. The metal TIM is interposed between the metal lid and the top surface of the semiconductor device for bonding the metal lid and the semiconductor device. The outermost point of the lateral sidewall is within the boundary of the semiconductor device. There is a gap between the bottom surface of the metal lid and the first surface of the package substrate to make the metal lid separate from the package substrate.

In accordance with some embodiments, a semiconductor device package is provided, including a package substrate, a semiconductor device, a metal lid, and a solder-based thermal interface material (TIM). The package substrate has a first surface. The semiconductor device is disposed over the first surface of the package substrate. The metal lid is disposed over the semiconductor device and the package substrate. The solder-based TIM is interposed between the metal lid and the top surface of the semiconductor device for bonding the metal lid and the semiconductor device. A shape of the lateral sidewall of the solder-based TIM in a longitudinal section is concave arc.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package, comprising:
a package substrate having a first surface;
a semiconductor device disposed over the first surface of the package substrate;
a metal lid disposed over the semiconductor device and the package substrate; and
a metal thermal interface material (TIM) interposed between the metal lid and a top surface of the semiconductor device for bonding the metal lid and the semiconductor device, wherein a shape of a lateral sidewall of the metal TIM in a longitudinal section is concave arc, and an outermost point of the lateral sidewall is within a boundary of the semiconductor device.

2. The semiconductor device package as claimed in claim 1, wherein the lateral sidewall of the metal TIM comprises two end points and an intermediate point between the two end points, wherein the two end points are connected to the metal lid and the semiconductor device, respectively, and closer to the boundary of the semiconductor device than the intermediate point in a lateral direction.

3. The semiconductor device package as claimed in claim 2, wherein the two end points of the lateral sidewall of the metal TIM are aligned with the boundary of the semiconductor device.

4. The semiconductor device package as claimed in claim 2, wherein the two end points of the lateral sidewall of the metal TIM are offset from the boundary of the semiconductor device toward a center of the top surface of the semiconductor device.

5. The semiconductor device package as claimed in claim 1, wherein the metal TIM is a solder-based TIM.

6. The semiconductor device package as claimed in claim 1, wherein the metal lid comprises a cover portion above the semiconductor device, and a ring portion extending from the cover portion toward the first surface of the package substrate and surrounding the semiconductor device, and
wherein a gap is formed between a bottom surface of the ring portion and the first surface of the package substrate.

7. The semiconductor device package as claimed in claim 1, wherein the metal lid comprises a cover portion above the semiconductor device, and a ring portion extending from the cover portion toward the first surface of the package substrate and surrounding the semiconductor device, and
wherein the semiconductor device package further comprises an adhesive layer arranged between a bottom surface of the ring portion and the first surface of the package substrate.

8. The semiconductor device package as claimed in claim 1, wherein when viewed in a horizontal direction parallel to the first surface of the package substrate, the lateral sidewall of the metal TIM close to the boundary of the semiconductor device is in a concave arc shape.

9. A semiconductor device package, comprising:
a package substrate having a first surface;
a semiconductor device disposed over the first surface of the package substrate;
a metal lid disposed over the semiconductor device and the package substrate; and
a metal thermal interface material (TIM) interposed between the metal lid and a top surface of the semiconductor device for bonding the metal lid and the semiconductor device, wherein an outermost point of the lateral sidewall is within a boundary of the semiconductor device, and
wherein there is a gap between a bottom surface of the metal lid and the first surface of the package substrate to make the metal lid separate from the package substrate, wherein the gap extends from an inner wall of the metal lid to an outer wall of the metal lid, and no adhesive is provided in the gap.

10. The semiconductor device package as claimed in claim 9, wherein the metal lid comprises a cover portion above the semiconductor device, and a ring portion extending from the cover portion toward the first surface of the package substrate and surrounding the semiconductor device, wherein the bottom surface of the metal lid is a bottom surface of the ring portion.

11. The semiconductor device package as claimed in claim 9, wherein the outermost point of the lateral sidewall of the molten metal TIM is aligned with the boundary of the semiconductor device in a lateral direction.

12. The semiconductor device package as claimed in claim 11, wherein a shape of the lateral sidewall of the molten metal TIM in a longitudinal section is a concave arc.

13. The semiconductor device package as claimed in claim 11, wherein a shape of the lateral sidewall of the molten metal TIM in a longitudinal section is straight.

14. The semiconductor device package as claimed in claim 9, wherein the outermost point of the lateral sidewall of the molten metal TIM is closer to a center of the top surface of the semiconductor device than the boundary of the semiconductor device in a lateral direction.

15. The semiconductor device package as claimed in claim 14, wherein a shape of the lateral sidewall of the molten metal TIM in a longitudinal section is a concave arc.

16. The semiconductor device package as claimed in claim 14, wherein a shape of the lateral sidewall of the molten metal TIM in a longitudinal section is straight.

17. A semiconductor device package, comprising:
a package substrate having a first surface;
a semiconductor device disposed over the first surface of the package substrate;

a metal lid disposed over the semiconductor device and the package substrate; and a solder-based thermal interface material (TIM) interposed between the metal lid and a top surface of the semiconductor device for bonding the metal lid and the semiconductor device, wherein a shape of a lateral sidewall of the solder-based TIM in a longitudinal section is concave arc.

18. The semiconductor device package as claimed in claim 17, wherein the lateral sidewall of the solder-based TIM comprises two end points and an intermediate point between the two end points, wherein the two end points are connected to the metal lid and the semiconductor device, respectively, and closer to a boundary of the semiconductor device than the intermediate point in a lateral direction, and wherein a distance between the intermediate point of the lateral sidewall of the solder-based TIM and an inner wall of a ring portion of the metal lid in the lateral direction is greater than a distance between the boundary of the semiconductor device and the inner wall of the ring portion of the metal lid in the lateral direction.

19. The semiconductor device package as claimed in claim 17, further comprising a buffer layer formed between the top surface of the semiconductor device and the solder-based TIM.

20. The semiconductor device package as claimed in claim 17, further comprising an electronic component mounted on the first surface of the package substrate.

* * * * *